(12) United States Patent
Zekentes et al.

(10) Patent No.: US 6,599,644 B1
(45) Date of Patent: Jul. 29, 2003

(54) METHOD OF MAKING AN OHMIC CONTACT TO P-TYPE SILICON CARBIDE, COMPRISING TITANIUM CARBIDE AND NICKEL SILICIDE

(75) Inventors: Konstantinos Zekentes, Crete (GR); Konstantin V. Vassilievski, St. Petersburg (RU)

(73) Assignee: Foundation for Research & Technology-Hellas, Crete (GR)

( * ) Notice: Subject to any disclaimer, the term of this patent is extended or adjusted under 35 U.S.C. 154(b) by 0 days.

(21) Appl. No.: 09/969,899

(22) Filed: Oct. 4, 2001

Related U.S. Application Data
(60) Provisional application No. 60/238,048, filed on Oct. 6, 2000.

(51) Int. Cl.[7] .............................................. H01L 33/00
(52) U.S. Cl. ..................... 428/627; 428/628; 428/651; 428/678; 428/446; 428/469; 428/698; 438/597; 438/602; 438/652; 438/656; 438/660; 438/683; 257/750; 257/766
(58) Field of Search ............................... 428/469, 698, 428/627, 628, 651, 678, 446; 257/77, 289, 750, 763, 766; 438/523, 597, 602, 607, 652, 656, 664, 680, 683, 931, 660

(56) References Cited

U.S. PATENT DOCUMENTS

| | | | |
|---|---|---|---|
| 5,124,779 A | 6/1992 | Furukawa et al. | 357/67 |
| 5,409,859 A | 4/1995 | Glass et al. | 437/187 |
| 5,442,200 A * | 8/1995 | Tischler | 257/77 |
| 5,597,744 A * | 1/1997 | Kamiyama et al. | 437/40 |
| 5,789,311 A * | 8/1998 | Ueno et al. | 438/573 |
| 5,877,077 A | 3/1999 | Kronlund et al. | 438/602 |
| 5,929,523 A | 7/1999 | Parsons et al. | 257/750 |
| 5,980,265 A | 11/1999 | Tischler et al. | 437/185 |
| 6,388,272 B1 * | 5/2002 | Odekirk | 257/77 |

FOREIGN PATENT DOCUMENTS

| | | |
|---|---|---|
| JP | 404085972 A * | 3/1992 |
| WO | WO 00/14805 | 3/2000 |

OTHER PUBLICATIONS

Vassilevski et al., "Structural And Morphological Characterization Of Al/Ti–based Ohmic Contacts on p–Type 4H–SiC Annealed Under Various Conditions," issued from the International Conference of Silicon Carbide and Related Materials (ICSCRM'99) at Raleigh, US on Oct. 11, 1999, p. 442.

ASM Handbook, vol. 3, "Alloy Phase Diagrams", Ed. H. Baker, p. 2.54.

(List continued on next page.)

*Primary Examiner*—Deborah Jones
*Assistant Examiner*—Stephen Stein
(74) *Attorney, Agent, or Firm*—Jeffrey I. Auerbach; Liniak, Berenato & White

(57) ABSTRACT

A method of producing an ohmic contact to p-type silicon carbide comprising two layers, the first one comprising nickel silicide and the second one comprising titanium carbide is disclosed. The deposited layers are annealed to convert at least a part of deposited metals to nickel silicide and titanium carbide. The contact is formed by reaction between the metals and the semiconductor, and thus the in-situ simultaneous formation of metal silicide and carbide suppress the release of excess carbon at the contact interface. Noble metals may be deposited preferably in between titanium and nickel to improve the contact morphology.

19 Claims, 10 Drawing Sheets

OTHER PUBLICATIONS

J. Crofton, L. Beyer, J. R. Williams, E. D. Luckowski, S. E. Mohney and J. M. Delucca, Sol. St. Electron., vol. 41 (1997), p. 1725 No Month.

K. V. Vassilevski, K. Zekentes, G. Constantinidis, N. Papanicolaou, I. P. Nikitina, A. I. Babanin, Mat. Sci. For. vols. 338–342, p. 1017 No Date.

K. V. Vassilevski, S. V. Rendakova, I. P. Nikitina, A. I. Babanin, A. N. Andreev, and K. Zekentes, Semiconductors, 33, 1206–1211, (1999) No Month.

D. C. Burkman, D. Deal, D. C. Grant, C. A. Peterson, Aqueous Cleaning Processes, in Handbook of semiconductor wafer cleaning technology: science, technology, and applications, ed. W. Kern, Noyes Publication, USA (1993) p. 120 No Month.

G. S. Marlow, M. B. Das, Solid–State Electronics, 25, 91–94, (1982).

E. D. Marshall, M. Murakami, "Contacts to Semiconductors, Fundamentals and Technology", Ed. L.J. Brillson, Noyes Publications, USA (1993) pp. 8–9 No Month.

I. Nashiyama, in: "Properties of Silicon Carbide", Ed. G. L. Harris, EMIS Data Reviews Series, No. 13. INSPEC, IEE, London, UK Chapter 4.1 (1995) pp. 87–92) No Month.

* cited by examiner (A)

(B)

METHOD OF MAKING AN OHMIC CONTACT TO P-TYPE SILICON CARBIDE, COMPRISING TITANIUM CARBIDE AND NICKEL SILICIDE

CROSS-REFERENCE TO RELATED APPLICATION

This Application is a continuation of, and claims priority to, U.S. Provisional Patent Application Serial No. 60/238,048 (filed Oct. 6, 2000).

FIELD OF THE INVENTION

The present invention relates to a method of successfully producing an ohmic contact to a p-type SiC substrate by formation of nickel silicide and titanium carbide.

BACKGROUND OF THE INVENTION

Most semiconductor devices need terminal connections to carry electric current to and from the internal of the semiconductor device. Such terminal connections, usually called "ohmic contacts", must not however impair the semiconductor device itself. Thus, the voltage drop over the ohmic contact should be negligible compared to the voltage drop across other areas of the semiconductor device at the current density in question.

The formation of low specific contact resistance ohmic contacts to p-type SiC is an open issue in SiC-related technology because of the large band gap and electron affinity of SiC. Although a number of metals and metal-like compositions have been tested as contacts to p-doped SiC, no metals with a work-function of about 6 eV are known to form the metal/p-type SiC junction without potential barrier. For this reason, the fabrication of ohmic contacts to p-type SiC even using metals with high work function (such as osmium (Parsons et al., "Os rectifying Schottky and ohmic junction and W/WC/TiC ohmic contacts on SiC", U.S. Pat. No. 5,929,523, (1999)) or platinum (Glass et al., Method of forming platinum ohmic contact to p-type silicon carbide, U.S. Pat. No. 5,409,859, (1995))) still requires a heavily doped (more than $10^{19}$ cm$^{-3}$) undercontact layer of semiconductor in order to allow carrier tunneling transport across the interface between the metal and the semiconductor.

Aluminum has been considered as a potential contact metal because it is a doping impurity of p-type in silicon carbide, but its low melting point, 660° C., makes it less convenient at high power or high temperature operation. Another problem with aluminum is its reactivity with oxygen that may result in insulating oxides. Thus, the most popular ohmic contacts to p-type 4H—SiC material are the Al/Ti based metallizations (Furukawa et al. "Silicon carbide semiconductor device with ohmic electrode consisting of alloy", U.S. Pat. No. 5,124,779). Indeed, the Al—Ti alloy is preferred over pure Al due to its higher melting point (1100° C. for Al/Ti 90/10 wt. %—ASM Handbook, Vol. 3, "Alloy Phase Diagrams", Ed. H. Baker, p. 2.54) thus, resulting in more thermally stable ohmic contacts. But titanium is characterized by a strong oxygen gettering effect, which causes small amounts of oxygen residues to be captured. These residues later oxidize the aluminum during the contact heat treatment. To overcome this problem, it was proposed to deposit aluminum, titanium and silicon layers (Kronlund et al, "Method of producing an ohmic contact and a semiconductor device provided with such ohmic contact" U.S. Pat. No. 5,877,077) that form an aluminum-titanium-silicide after a heat treatment. During the tri-metal aluminum-titanium-silicide formation any bound oxygen is rejected from the SiC-metal interface but a necessary condition for obtaining a low contact resistance value is that the interface has to move inside SiC during silicide formation. Moreover, in the case of ohmic contacts to p-type SiC with Al-containing silicides or alloys, an additional problem to the above mentioned of contact oxidation, is the aluminum evaporation from the top surface of the deposited metals (J. Crofton, L. Beyer, J. R. Williams, E. D. Luckowski, S. E. Mohney and J. M. Delucca, Sol. St. Electron., Vol 41 (1997), p. 1725). The value of the specific contact resistance is directly related to the quantity of aluminum, which does remain in the metallization. The above analysis clearly shows that, obtaining ohmic contacts with low values of specific contact resistance is a very delicate task for Al/Ti alloys and silicides posing serious problems of reproducibility.

Silicides and carbides are the ideal contact compounds concerning stability at high temperatures. Formation of silicides is more preferable comparing with carbides, because of their lower resistivity. Metal silicide may be formed by two ways: (1) by interaction of the deposited metal with deposited silicon; or (2) by interaction of the metal with silicon carbide. The first case was thoroughly investigated as the metal silicide contains very few carbonaceous species like free elemental carbon, carbides and other carbon-containing compounds that are considered as factors increasing the contact resistance. Stable contacts on n-type 6H—SiC have been obtained (Tischler et al., "Low resistance, stable ohmic contacts to silicon carbide, and method of making the same", U.S. Pat. No. 5,980,265, (1999)) by depositing a sacrificial silicon layer before deposition of various metals and forming metal silicides following annealing. In addition, the sacrificial silicon layer was in most cases doped with a common dopant of silicon carbide. In this way, a thin top layer of SiC was doped during the annealing step thus reducing the contact resistance. However, for this purpose a long annealing of 1 hour at temperatures higher than 1000° C. was necessary. Another possible way to overcome the problem of the produced carbonaceous species during reaction with the SiC is to form simultaneously suicides and carbides with the silicon and the carbon, which are released from SiC during high temperature heat treatment (K. V. Vassilevski, K. Zekentes, G. Constantinidis, N. Papanicolaou, I. P. Nikitina, A. I. Babanin, Mat. Sci. For. Vols. 338–342, p. 1017). In a similar way, ohmic contacts on n-type SiC have been obtained (Bartsch et al. "Semiconductor device having ohmic contact and a method for providing ohmic contact with such a device" WO 00/14805). However, SiC decomposition by this way is not easily controlled and this process is usually undesirable for fabrication of ultrahigh frequency devices usually having shallow p-n junctions. At least, the depth of the SiC decomposition should be well defined and uniform over the sample area.

SUMMARY OF THE INVENTION

The present invention concerns a method of producing an ohmic contact to p-type silicon carbide comprising of two layers the first one comprising nickel silicide and the second one comprising titanium carbide. The layers of titanium and nickel are deposited on p-type SiC and an aluminum layer is deposited preferably at the interface between the silicon carbide and the above metals of titanium and nickel. The deposited layers are annealed to convert at least a part of deposited metals to nickel silicide and titanium carbide while aluminum is surface evaporated. The contact is formed by reaction between the metals and the semiconductor, and thus the in-situ simultaneous formation of metal silicide and carbide suppress the release of excess carbon at the contact interface. The presence of aluminum is necessarily employed prior to heat treatment to lower the contact resistivity. Noble metals may be deposited preferably in between titanium and nickel to improve the contact morphology.

In detail, the invention provides a method of forming an ohmic contact to a p-type SiC substrate, comprising the steps of:

(A) depositing the layers of aluminum, titanium and nickel on the p-type SiC substrate; and then, (B) heat treating the resulting article for sufficient time and at sufficient temperature to convert at least part of it to titanium carbide and nickel silicide by reaction of SiC with the contact metals of titanium and nickel.

The invention particularly concerns the embodiments of such method wherein the heat treatment is carried out at a temperature in the range of from about 850° C. to about 1150° C.

The invention further concerns the embodiments of the above methods wherein one or more layers of one or more noble metals (especially platinum, gold or palladium species) are deposited preferably in between titanium and nickel contact metals.

The invention further concerns the embodiments of the above methods wherein the depositing layer(s) comprise(s) are formed through a method selected from the group consisting of chemical vapor deposition, sputtering and evaporation from a metal source.

The invention particularly concerns the embodiments of the above methods wherein the p-type SiC substrate is a part of multilayer epitaxial structure or single crystal of SiC. The invention particularly concerns the embodiments of such method wherein the p-type SiC substrate has an acceptor concentration of equal to or greater than about $10^{18}$ cm$^{-3}$, and/or the contact has a specific contact resistance to SiC of less than about $10^{-4}$ ohm·cm$^2$.

The invention further provides an ohmic contact to a p-type SiC substrate, comprising titanium carbide and nickel silicide, optionally containing one or more layers of one or more noble metals (especially wherein the noble metals are platinum, gold or palladium species). The invention also provides such ohmic contacts, wherein the p-type SiC substrate is a part of multilayer epitaxial structure or single crystal of SiC. The invention also provides such ohmic contacts, wherein the p-type SiC substrate has an acceptor concentration $10^{18}$ cm$^{-3}$ and higher. The invention also provides such ohmic contacts, wherein the contact has a specific contact resistance to SiC of less than $10^{-4}$ ohm·cm$^2$.

The invention also provides an ohmic contact to a p-type SiC substrate, comprising titanium carbide and nickel silicide, optionally containing one or more layers of one or more noble metals, wherein the contact is made by the method, comprising the steps of:

(A) depositing one or more layers of aluminum, titanium and nickel on the p-type SiC substrate; and then, (B) heat treating the resulting article for sufficient time and at sufficient temperature to convert at least part of the deposited material to titanium carbide and nickel silicide by reaction of SiC with the contact metals of titanium and nickel.

The invention concerns such ohmic contacts, wherein the heat treatment is carried out at a temperature in the range of from about 850° C. to about 1150° C., and/or wherein one or more layers of noble metals (especially platinum, gold or palladium species) are deposited preferably in between said titanium and nickel contact metals. The invention particularly concerns such ohmic contacts wherein at least one of said depositing layers is formed using a method selected from the group consisting of chemical vapor deposition, sputtering and evaporation from a metal source.

DESCRIPTION OF THE FIGURES

The invention will be described more in detail below with reference to the accompanying drawings, which illustrate preferred and exemplary embodiments, and wherein.

DETAILED DESCRIPTION OF THE PREFERRED EMBODIMENTS

Figure 1:
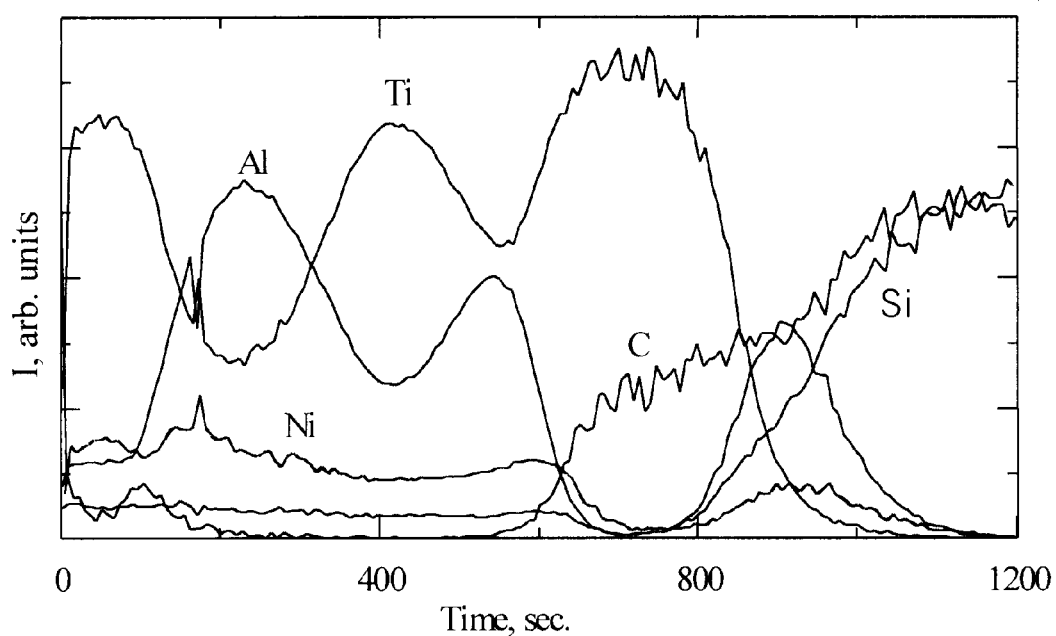
FIG. 1 shows a SIMS profile of contact metallization after vacuum anneal (inductive heating) for 50 sec at 1150° C. in 500 Pa of $H_2$ at 340 sccm. The Y-axis is the intensity of the signal, I in arbitrary units; the X-axis is time.

In a preferred embodiment, the present invention provides a method of producing an ohmic contact to a p-type SiC substrate, which comprises the step of depositing aluminum, titanium and nickel in that order and the subsequent step of heat treatment, for sufficient time and at sufficient temperature, to form titanium carbide and nickel silicide by reaction of SiC with the contact metals of titanium and nickel. The p-type SiC substrate is either bulk crystal or an epitaxial layer of SiC p-type doped.

In a preferred embodiment, the aforementioned p-type SiC substrate is of the 3C, 4H, 6H, 15 R polytype.

In a preferred embodiment, the aforementioned p-tape SiC substrate has an acceptor concentration $10^{18}$ cm$^{-3}$ and higher.

In a preferred embodiment, the aforementioned heat treatment is carried out at a temperature of at least 850° C. Any suitable method may be employed to accomplish such heat treatment, including lasers, heat lamps, etc.

In a preferred embodiment, a noble metal layer is deposited preferably in between the titanium and the nickel layers.

In a further preferred embodiment, the aforementioned noble metal layer is of platinum, or palladium or gold material.

Thus, the invention described herein makes possible the objectives of (1) producing ohmic contacts which comprise titanium carbide and nickel silicide thereby attaining a thermally stable ohmic contact; (2) producing ohmic contacts comprising titanium carbide and nickel silicide which exhibit reproducibly low typical contact resistivity values for silicon carbide substrates having an acceptor concentration $10^{18}$ cm$^{-3}$ and higher; (3) producing ohmic contacts comprising titanium carbide and nickel silicide for which decomposition of the SiC under the contact is limited to a uniform depth of about 100 nm (i.e. sufficiently small comparing to typical thickness of epitaxial layers for ultra high frequency devices); (4) producing ohmic contacts comprising titanium carbide and nickel silicide which has a good adhesion for deposition of a metal overlay preferably gold for packaging purposes.

Having now described the invention in detail, the same may be better understood and its numerous objectives and advantages become, more apparent to those familiar in the art by reference to the following Examples which are not intended to restrict or limit the subject matter of the invention.

EXAMPLE 1

The most popular ohmic contacts to p-type 4H—SiC material are Al/Ti based metallizations (Porter et al., Mater. Sci. Eng. B 34, 83 (1995); Crofton, J. et al, Sol. St. Electron., Vol 41(1997), p. 1725). However, aluminum has a high driving force for oxidation that can deteriorate the quality of the ohmic contact. In addition, reproducibility problems occur when the SiC doping does not exceed $1 \times 10^{19}$ cm$^{-3}$ whatever the metallization scheme (Vassilevski, K. V. et al., Proc. ECSCRM'98 Conference, September 1998, Montpellier, France).

In order to overcome the above problems in fabricating low resistivity ohmic contacts, three processing approaches were combined and successfully applied. More precisely, vacuum annealing coupled with metal cap layers (Pd/Ni and Ni/Pt) resulted in non-oxidized contacts independent of the heating method (Rapid Thermal Annealing-RTA, resistive and inductive). In addition, a heavily doped p-type 4H—SiC layer with an aluminum concentration of approximately $1.5 \times 10^{20}$ cm$^{-3}$ was grown (TDI Inc., 8660 Dakota Dr., Gaithersburg, Md. 20877, USA) by low temperature Liquid Phase Epitaxy (LPE) prior to metal contact deposition. The above approach resulted in reproducible and of low specific contact resistance ($\approx 1 \times 10^{-4}$ $\Omega \cdot$cm$^2$) ohmic contacts (Vassilevski, K. V. et al., Proc. ECSCRM'98 Conference, September 1998, Montpellier, France).

Auger Electron Spectroscopy (AES) and Secondary Ion Mass Spectroscopy (SIMS) depth profiles were performed to determine the structural and morphological characterization of the above contacts, while X-Ray Diffraction (XRD) was used for phase analysis. Surface morphology was investigated by Nomarski, Scanning Electron (SEM) and Atomic Force Microscopy (AFM) methods. The investigation was conducted on Circular Transmission Line Model (CTLM) patterns also used for specific contact resistance measurements.

Figure 2:
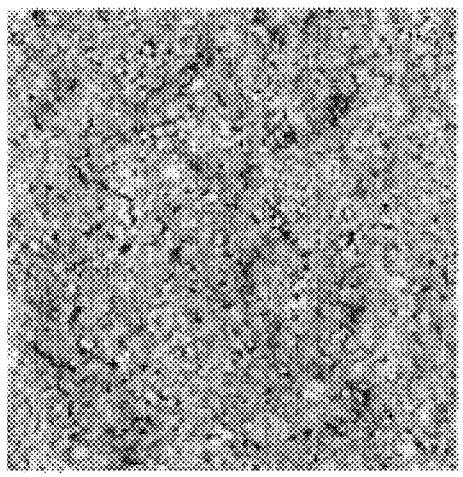
FIG. 2 shows AFM photos (5 $\mu$m×5 $\mu$m with 100 nm z-scan) of the surface: of the contact with Ni/Pd and with Pt/Ni cap layers respectively (from left to the right).
Figure 2:
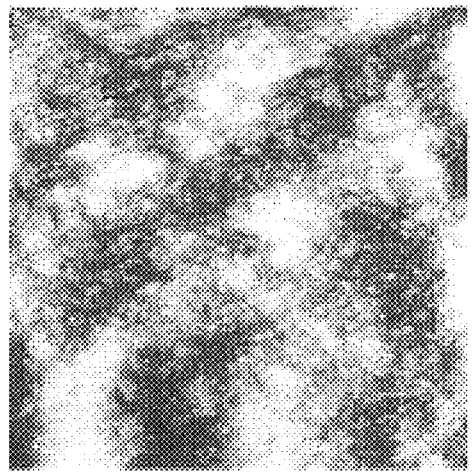

The first results of the AES analysis showed evidence of oxidation from the surface to the interface with the SiC, for annealing in neutral gas environment. Only the samples annealed under vacuum conditions were in-depth oxygen-free. Moreover, there is an evident correlation of the AES profiles with the SIMS profiles (see FIG. 1) concerning the Ti, Si, C and Ni inter-diffusion. XRD spectra showed the presence of non-reacted Al while, the AES profile showed that the composition of Al in the metallization is less than 10%. However, it is evident from the SIMS profile that Al forms the contact metal to SiC and there is an interdiffusion with Ti. In FIG. 2, the characteristic roughness for the two different cap schemes is shown. The contact with Pt/Ni cap has a higher roughness but it does not exceed 50 nm in all cases.

EXAMPLE 2

In this case, the p-type SiC substrate is a 4H—SiC polytype layer grown by Liquid Phase Epitaxy (LPE) (K. V. Vassilevski, S. V. Rendakova, I. P. Nikitina, A. I. Babanin, A. N. Andreev, and K. Zekentes, Semiconductors, 33, 1206–1211, (1999). The acceptors concentration, which in this case were Al atoms, was measured by Secondary Ion Mass Spectrometry (SIMS) and it was around $1.5 \times 10^{20}$ cm$^{-3}$.

Prior to contact fabrication, the SiC sample was cleaned sequentially by (1) degreasing in organic solvents, (2) bathing in De-Ionized water (DI) and, finally, through the use of a standard RCA cleaning procedure (D. C. Burkman, D. Deal, D. C. Grant, C. A. Peterson, Aqueous Cleaning Processes, in Handbook of semiconductor wafer cleaning technology: science, technology, and applications, ed. W. Kern, Noyes Publication, USA (1993) p.120). Dipping of the sample in 10% HF for 2 min at room temperature was performed in between the above steps. The circular Transmission Line Model (TLM) geometry of the contacts to p$^+$ epitaxial layer was defined by contact UV lithography. Immediately prior to placing the sample in the vacuum chamber, the sample patterned with AZ 5214 photo resist was immersed in 10% HF for 10 sec at room temperature, followed by rinsing in deionized (DI) water and blow drying with nitrogen. The metal deposition was made by e-beam evaporation at a residual pressure<$5 \times 10^{-7}$ mbarr without heating of the substrate during the process. The metals were deposited in a single run in the following sequence: Al(50 nm)/Ti(100 nm)/Pt(25 nm)/Ni(50 nm). After excess metal removal by lift-off in acetone, the rapid thermal annealing (RTA) process was performed by lamps at about 1000° C. for 120 sec in a commercial RTA chamber pumped down to $4 \times 10^{-5}$ Torr.

Figure 3:
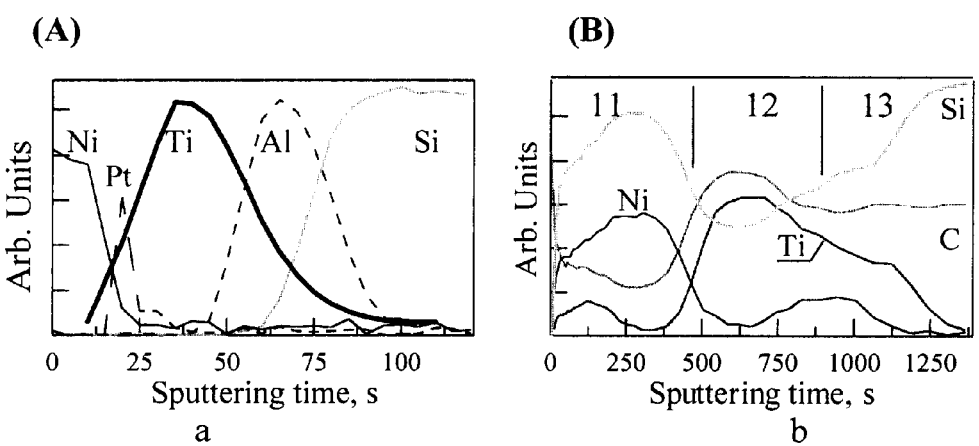
FIG. 3(a) and FIG. 3(b) are Auger depth profiles of an ohmic contact according to the present invention (a) before annealing and (b) annealed at 1000° C. for 120 sec: region 11—Ni silicide containing contact layer; region 12—Ti carbide containing contact layer; region 13-p-type SiC substrate.
Figure 4:
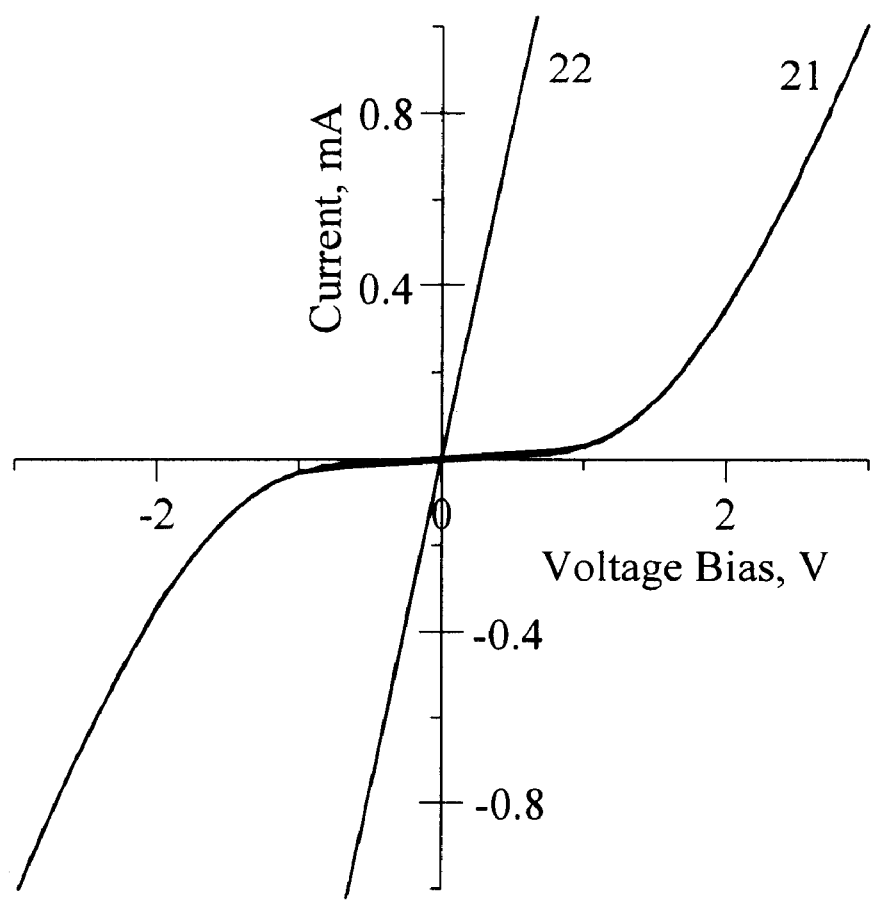
FIG. 4 is a current-voltage characteristic diagram measured between two contact pads of the TLM structure for contacts fabricated without (line denoted 21) and with (line denoted 22) aluminum (50 nm) layer on the same SiC substrate. For both contacts, the Ti (100 nm)/Pt (25 nm)/Ni (50 nm) deposition as well as the subsequent annealing were performed in the same process runs.

The contact composition was investigated by Auger electron spectroscopy (AES) depth profiling. FIG. 3(a) shows the Auger depth profile of the deposited metals prior to annealing. The annealing process (FIG. 3(b)) led to formation of layered contact structure having two clearly separated regions: (a) close to the surface where the curves corresponding to Ni and Si are parallel as well as of higher intensity and (b), close to the interface with SiC where the curves corresponding to Ti and C are parallel as well as of higher intensity. The parallel curves are a clear indication of stoichiometric material formation. Indeed, nickel silicide is formed by reaction of nickel with the silicon of SiC and the titanium carbide is formed by the reaction of titanium with the carbon of SiC. The results of X-Ray Diffraction (XRD) analysis reported in Example 4 corroborate this conclusion. Thus, the creation of this ceramic containing metal (cermet) contact layer is progressing simultaneously with the decomposition of SiC. Al was not detected by the AES analysis of the annealed samples and an Al/Ti alloy is not formed in the case of the ohmic contact proposed by the present invention. However, Al is necessary for lowering the resistance of the ohmic contact, as it is obvious from FIG. 4 in which case the Al presence was necessary for obtaining an ohmic behavior. Although the inventors do not wish to be bound by any particular theory, it appears most likely that Al decreases the potential barrier existing at the interface metal-semiconductor, that carriers have to overcome for traversing this interface.

Figure 5:
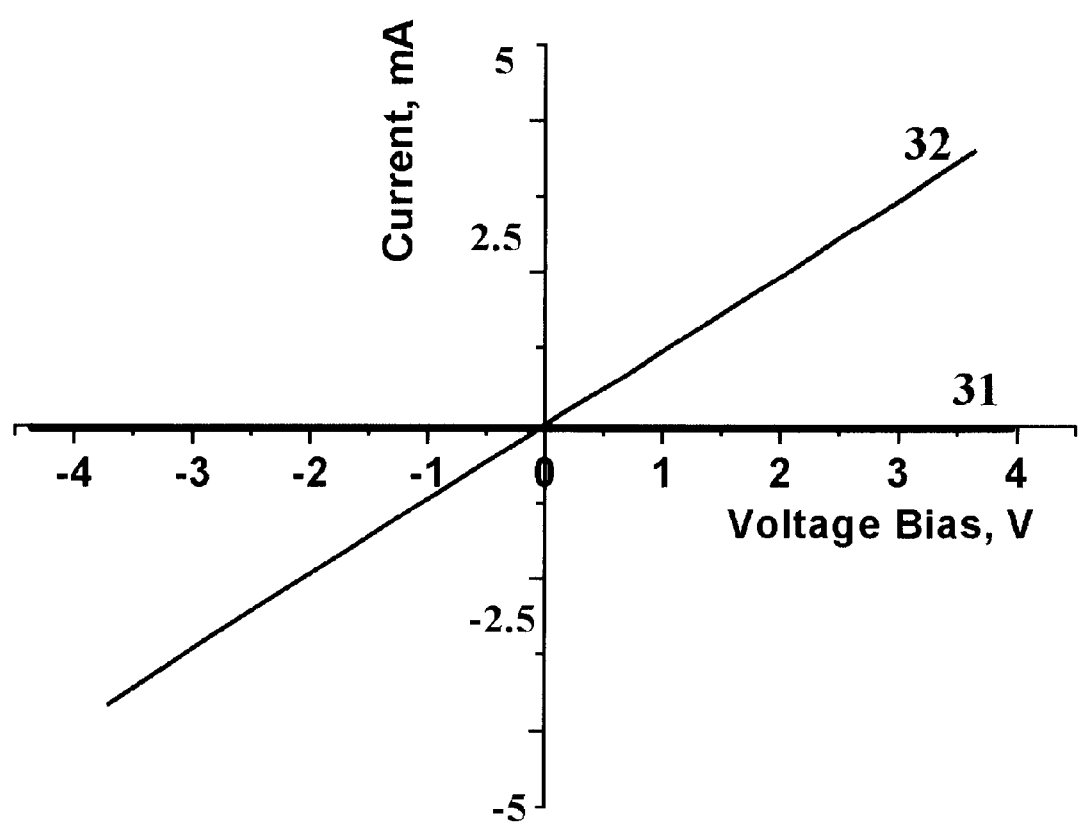
FIG. 5 is a current-voltage characteristic diagram measured between two contact pads of the TLM structure for contacts before (line 31) and after (line 32) heat treatment for contacts similar to that of FIG. 3(a) and FIG. 3(b) respectively.

FIG. 5 shows the current-voltage (I-V) characteristics of the sample measured between two contact pads of the TLM structure before (line denoted 31) and after annealing (line denoted 32). The linear behavior of the line 32 shows the ohmic character of the contact while before annealing no current is passing through. The value of the specific contact resistance extracted from the current-voltage measurements performed on the circular TLM patterns was slightly less than $10^{-4}$ ohm·cm$^2$.

Figure 6:
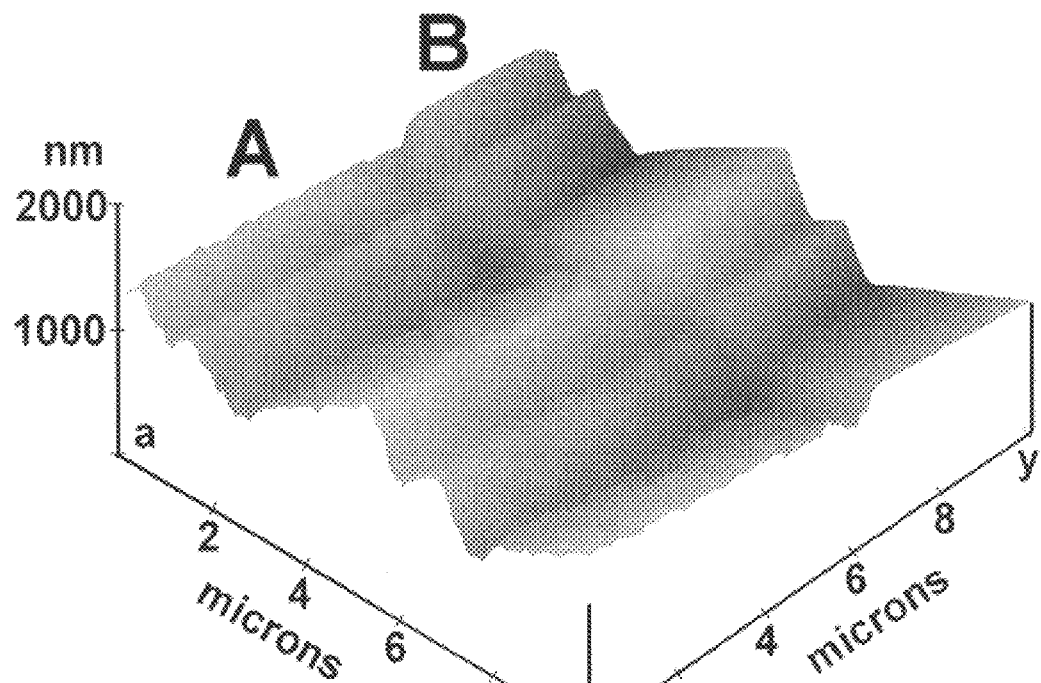
FIG. 6(a) and FIG. 6(b) are an AFM (a) 3D view and (b) cross section profile of the surface of 4H—SiC surface after removal of the ohmic contact according to the invention. A—surface after contact removal; B—free surface. The step height between the two arrows in FIG. 6(b) is equal to 110 nm.
Figure 6:
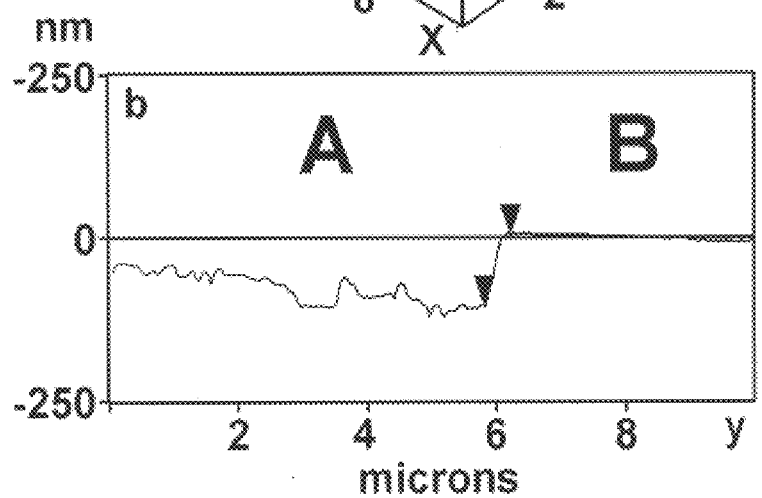

To estimate the depth of SiC that is decomposed during ohmic contact formation, the contacts were removed by sequential dipping of the sample in aqua regia and HNO$_3$:HF (3:1) for several times. The morphology of the 4H—SiC after contact removal was investigated by Atomic Force Microscopy (AFM). FIG. 6(a) and FIG. 6(b) show the AFM image (3D view (a) and cross-section profile (b)) of the sample in the region of the contact edge. It is clearly seen, that the contact formation caused a SiC decomposition to a depth of about 100 nm. The steps along the y-axis are due to the SiC epitaxial growth process. The mean roughness of the recess floor (i.e. where the contact structure was present before the etch) was estimated to be about 30 nm, while the mean roughness of the free surface (i.e. without any contact formation) measured between growth steps was no more than 3 nm.

Figure 7:
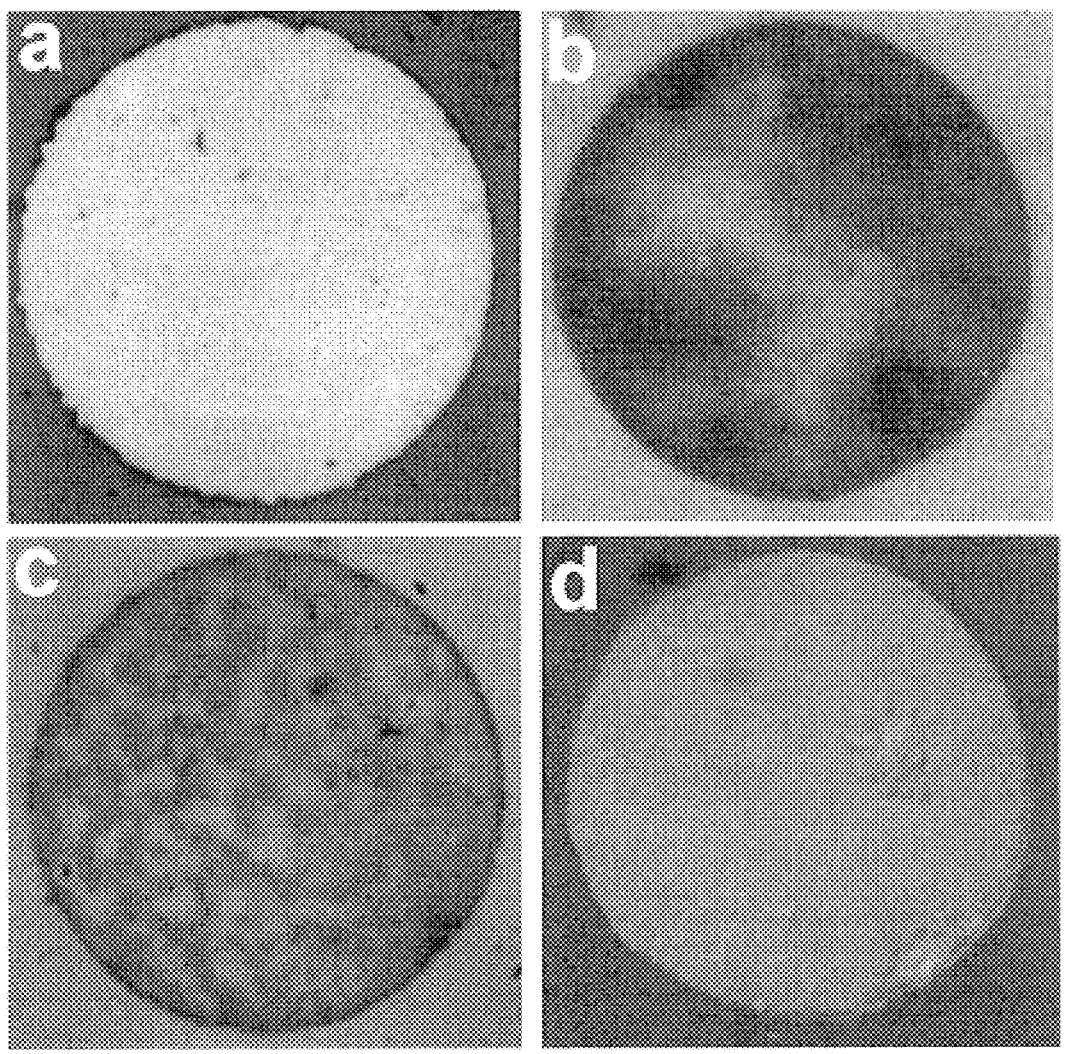
FIG. 7 is a Nomarski photo of the Al/Ti/Pt/Ni contact (a) before annealing and (b), (c), (d) annealed by RTA at 1000° C. for 120 sec. Contact diameter is 40 $\mu$m. The thickness of Pt layer is (a) 25 nm; (b) 10 nm; (c) 20 nm; and (d) 25 nm.

Introducing the platinum, gold or palladium layer preferably in the interface between Ni and Ti led to reduction of contact surface roughness (see FIG. 7) and to the improvement of the gold overlay adhesion.

EXAMPLE 3

In this case, the p-type SiC substrate is a layer being part of a 4H—SiC p$^+$-n-n$^+$ epitaxial structure. This structure was grown on Si-face of n-type 4H—SiC substrate with orientation 8 degrees off basal plane. The thickness and the doping levels of the layers were verified by secondary ion mass spectrometry (SIMS). The aluminum atoms concentration in the 1 $\mu$m thick p$^+$ layer was found to be of ~1.5×10$^{19}$ cm$^{-3}$, while the acceptor concentration in the p$^+$ layer was equal to (6–8)×10$^{18}$ cm$^{-3}$, according to Hg-probe capacitance-voltage measurements. Therefore, about ~50% of aluminum atoms are electrically activated in the p$^+$ layer, as it was deduced from the comparison of the Hg-probe measurement results with the data obtained by SIMS.

The contact fabrication procedure was the same as that reported in the above Example 2. In addition, a gold overlay of 200 nm in thickness was deposited for improving the current spreading in the contact metallization and the electrical contact between the contact pads and the tips of the probe station. A commercial plasma system was used to form the mesa structures for the measurement of the contact resistivity by linear TLM method (pads size 40×80 $\mu$m$^2$ with distances 4, 8, 12, and 16 $\mu$m between them). A 200 nm aluminum mask was deposited on the p-type epitaxial layer. The chamber was pumped down to 2×10$^{-5}$ mbar before the etch process. Uncovered SiC was etched away down to the n$^+$ epitaxial layer. After the SiC etching, the Al mask was selectively removed in KOH solution.

Figure 8:
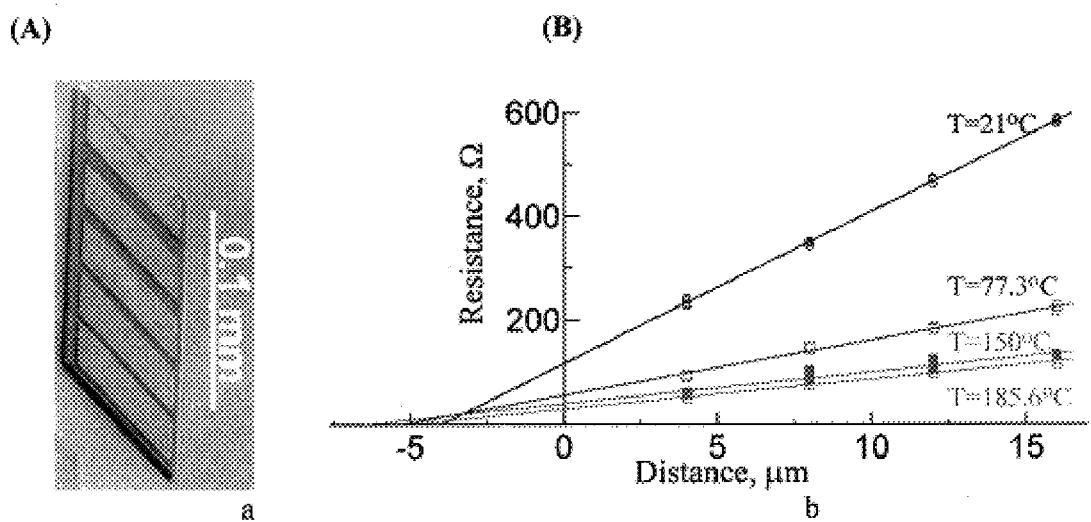
FIG. 8(a) and FIG. 8(b) are (a) a TLM mesa structure formed on 4H—SiC p$^+$-n-n$^+$ epitaxial wafer and (b) the resistance dependencies on the distance between contact pads for various temperatures.
Figure 9:
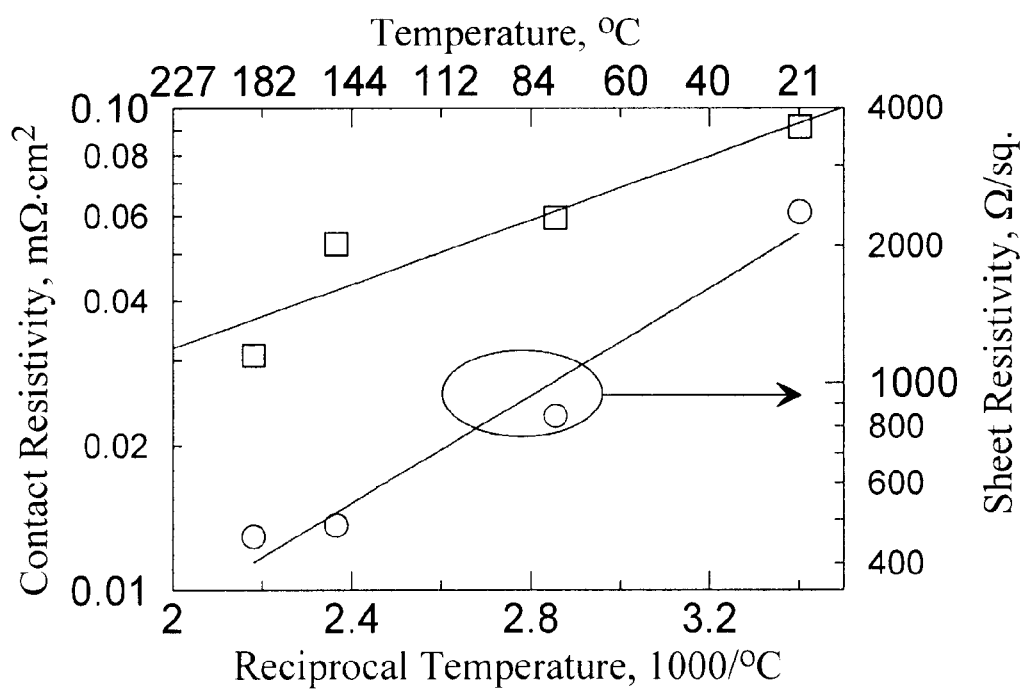
FIG. 9 is a plot of contact specific transition resistance and sheet resistivity of p-doped 4H—SiC layer on reciprocal temperature.

Electrical characterization of the contacts was performed by linear transmission line model (TLM) (G. S. Marlow, M. B. Das, Solid-State Electronics, 25, 91–94, (1982)) in the temperature range from 21 to 186° C. TLM mesa structure formed on 4H—SiC p$^+$-n-n$^+$ epitaxial wafer is shown in FIG. 8(a). The I-V characteristics measured between two contact pads were linear up to the current value of about 6 mA, at which the voltage drop was exceeding 3 V and current spreading in the n-layer was occurred. The contact resistivity at room temperature was measured before and after sample heating and was found to be the same. The measurements were carried out in the air ambient. The resistance dependencies on the distance between contact pads for various temperatures are shown in FIG. 8(b). The contacts revealed specific contact resistance of 9·10$^{-5}$ ohm·cm$^2$ at 21° C. decreasing to 3.1·10$^{-5}$ ohm·cm$^2$ at 186° C. The strong dependence of the contact resistivity on the temperature is shown in FIG. 9. Although the inventors do not wish to be bound by any particular theory, this dependence is characteristic for contacts formed to relatively low doped semiconductors, where thermionic emission is the predominant current transport mechanism (E. D. Marshall, M. Murakami, "Contacts to Semiconductors, Fundamentals and Technology", Ed. L. J. Brillson, Noyes Publications, USA (1993) pp. 8–9). The dependence of the sheet resistivity of p-type SiC epitaxial layer on reciprocal temperature is also shown in FIG. 9. The slope of the best fit of experimental data gives the value of acceptor ionization energy about 200 meV. This value is very close to the published experimental data (I. Nashiyama, in: "Properties of Silicon Carbide", Ed. G. L. Harris, EMIS Data Reviews Series, No. 13. INSPEC, IEE, London, UK Chapter 4.1 (1995) pp. 87–92) and it confirms the accuracy of the performed measurements.

EXAMPLE 4

In this case, the SiC substrate is a 6H—SiC single crystal grown by the Lely method. The contacts were fabricated in an identical way as that described in the above Example 2. The only modification in the whole process was that metal layers were deposited all over the SiC substrate surface. In this way, the resulting sample is optimized for structural investigation.

Figure 10:
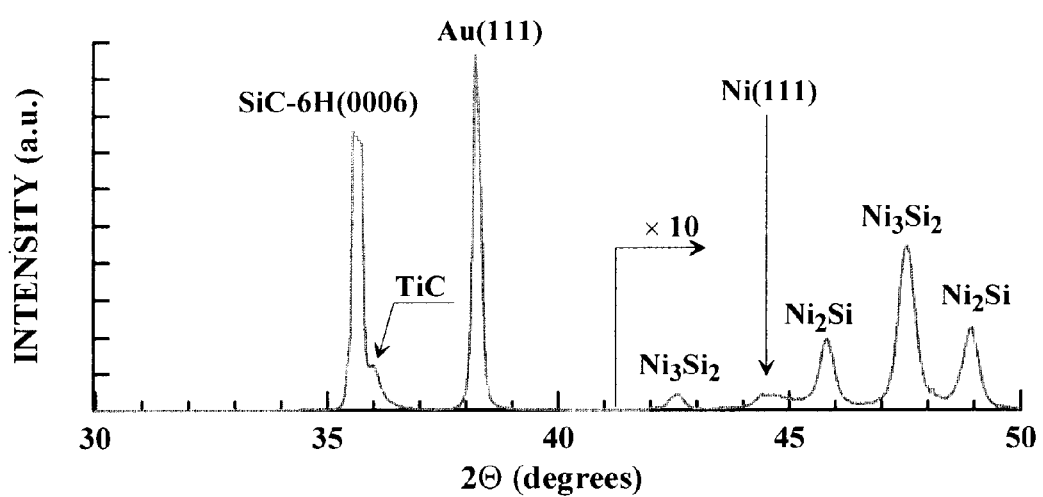
FIG. 10 is an x-ray phase analysis plot for the ohmic contact according to the invention covered by a gold overlay.

Phase analysis of the ohmic contacts was performed by x-ray diffraction. Results of x-ray phase analysis are shown in FIG. 10. It was found that the contact layer contained Ni$_2$Si, Ni$_3$Si$_2$ and TiC components after annealing. The introduction of the platinum layer in the contact metal composition had no effect on the formation of the cermet structure containing nickel silicides and titanium carbide.

Indeed, creation of $Ni_2Si$ and TiC was also discovered when Pd was used instead of Pt layer.

While the invention has been described herein with reference to specific aspects, features, and embodiments, it will be apparent that other variations, modifications, and embodiments are possible, and all such variations, modifications, and embodiments therefore are to be regarded as being within the spirit and scope of the invention.

What is claimed is:

1. A method of forming an ohmic contact to a p-type SiC substrate, comprising the steps of:
   (A)(1) depositing a layer of aluminum, titanium and nickel, in that order, on said p-type SiC substrate to form aluminum, titanium and nickel metal contacts;
      (2) optionally repeating said step (A)(1) one or more times to form a series of said aluminum, titanium and nickel layers; and then,
   (B) heat treating the resulting article for sufficient time and at sufficient temperature to convert at least part of said deposited material to titanium carbide and nickel silicide by reaction of SiC with said titanium and nickel metal contacts.

2. The method of claim 1, wherein said heat treatment is carried out at a temperature in the range of from about 850° C. to about 1150° C.

3. The method of claim 1, wherein one or more layers of noble metals are deposited in between said titanium and nickel metal contacts.

4. The method of claim 3, wherein said noble metals are platinum, gold or palladium species.

5. The method of claim 1 or 3 wherein at least one of said depositing layers is formed using a method selected from the group consisting of chemical vapor deposition, sputtering and evaporation from a metal source.

6. The method of claim 1, wherein said p-type SiC substrate is a part of multilayer epitaxial structure or single crystal of SiC.

7. The method of claim 1, wherein said p-type SiC substrate has an acceptor concentration of $10^{18}$ $cm^{-3}$ or higher.

8. The method of claim 1, wherein said contact has a specific contact resistance to SiC of less than $10^{-4}$ ohm·$cm^2$.

9. An ohmic contact to a p-type SiC substrate, said ohmic contact comprising a layer of aluminum, titanium and nickel, deposited in that order on said p-type SiC substrate, wherein aluminum, titanium and nickel of said layer form titanium carbide and nickel silicide.

10. The ohmic contact of claim 9, wherein said noble metals are platinum, gold or palladium species.

11. The ohmic contact of claim 9, wherein said p-type SiC substrate is a part of multilayer epitaxial structure or single crystal of SiC.

12. The ohmic contact of claim 9, wherein said p-type SiC substrate has an acceptor concentration $10^{18}$ $cm^{-3}$ and higher.

13. The ohmic contact of claim 9, wherein the contact has a specific contact resistance to SiC of less than $10^{-4}$ ohm·$cm^2$.

14. An ohmic contact to a p-type SiC substrate, comprising titanium carbide and nickel silicide, optionally containing one or more layers of one or more noble metals, wherein said contact is made by the method comprising the steps of:
   (A)(1) depositing a layer of aluminum, titanium and nickel, in that order, on said p-type SiC substrate to form aluminum, titanium and nickel metal contacts;
      (2) optionally repeating said step (A)(1) one or more times to form a series of said aluminum, titanium and nickel layers; and then,
   (B) heat treating the resulting article for sufficient time and at sufficient temperature to convert at least part of said deposited material to titanium carbide and nickel silicide by reaction of SiC with said titanium and nickel metal contacts.

15. The ohmic contact of claim 14, wherein said heat treatment is carried out at a temperature in the range of from about 850° C. to about 1150° C.

16. The ohmic contact of claim 14, wherein one or more layers of noble metals are deposited in between said titanium and nickel contact metals.

17. The ohmic contact of claim 14, wherein said noble metals are platinum, gold or palladium species.

18. The ohmic contact of claim 14 or 16, wherein at least one of said depositing layers is formed using a method selected from the group consisting of chemical vapor deposition, sputtering and evaporation from a metal source.

19. The ohmic contact of claim 9, wherein said ohmic contact additionally contains one or more layers of one or more noble metals.

* * * * *